(12) United States Patent
Beier et al.

(10) Patent No.: US 8,686,801 B2
(45) Date of Patent: Apr. 1, 2014

(54) POWER SUPPLY AND DC-DC-CONVERSION

(76) Inventors: Ralf Beier, Hamburg (DE); Gerhard Osterloh, Schülp (DE); Michael Gattung, Hamburg (DE)

( * ) Notice: Subject to any disclaimer, the term of this patent is extended or adjusted under 35 U.S.C. 154(b) by 494 days.

(21) Appl. No.: 12/858,829

(22) Filed: Aug. 18, 2010

(65) Prior Publication Data

US 2011/0050315 A1    Mar. 3, 2011

(30) Foreign Application Priority Data

Aug. 28, 2009 (EP) ..................... 09168891

(51) Int. Cl.
*H03K 3/26* (2006.01)

(52) U.S. Cl.
USPC ............ 331/111; 331/143; 331/74; 323/280; 323/281; 323/282; 323/268; 327/172; 327/175; 363/41

(58) Field of Classification Search
USPC ................. 331/2, 46, 282, 144, 111, 74, 143; 323/282, 280, 281, 268; 363/41; 327/172, 175
See application file for complete search history.

(56) References Cited

U.S. PATENT DOCUMENTS

| | | | |
|---|---|---|---|
| 6,057,675 A | 5/2000 | Tateishi | |
| 6,608,521 B1 | 8/2003 | Baldwin et al. | |
| 7,215,104 B2 | 5/2007 | Nakata et al. | |
| 2001/0054883 A1 | 12/2001 | Rincon-Mora | |
| 2007/0108947 A1 | 5/2007 | Liao et al. | |

OTHER PUBLICATIONS

Extended European Search Report for European patent appln. No. 09168891.1 (Dec. 30, 2009).

*Primary Examiner* — Arnold Kinkead

(57) ABSTRACT

In an embodiment of a converter, a first oscillator provides switching signals for switching between charging and discharging of a capacitor, and a second oscillator is configured to add an offset voltage or a feedback-current-dependent voltage to a sawtooth waveform generated by the second oscillator switched in synchronism with the first oscillator.

20 Claims, 3 Drawing Sheets

POWER SUPPLY AND DC-DC-CONVERSION

This application claims the priority under 35 U.S.C. §119 of European patent application no. 09168891.1, filed on Aug. 28, 2009 the contents of which are incorporated by reference herein.

FIELD OF THE INVENTION

At least one or more embodiments generally relate to sawtooth waveform generation, an oscillator, a power supply and DC-DC (DC=direct current or voltage, unipolar current or voltage) conversion.

BACKGROUND OF THE INVENTION

U.S. Pat. No. 7,215,104 describes an DC/DC converter which is configured to provide a desired output setting voltage at a load-side output. The DC-DC converter comprises an oscillator outputting an oscillation clock to a slope circuit. The slope circuit generates a sawtooth waveform voltage having a slope which begins at the leading edge of the oscillation clock. A comparator compares the sawtooth waveform voltage and an output voltage of an error amplifier. A logic circuit is set by the trailing edge of the oscillation clock, and is reset by the output of the comparator.

In some cases, sub harmonic oscillations or oscillation due to instabilities may occur e.g. if the duty cycle is higher than 50%. Further, with increasing switching frequency of a DC/DC converter of e.g. 6 MHz, it is difficult to process feedback signals such as adding two signals with adequate current consumption and no extra signal delay.

SUMMARY OF THE INVENTION

In accordance with one or more of the embodiments a fast adding circuit for combining a current feedback signal and an oscillator signal in a DC/DC converter is provided which does not cause additional delay.

In accordance with an aspect of the invention, a feedback circuit for a switch mode power supply is provided which is able to create a slope compensation to avoid sub harmonic oscillation or oscillation due to instabilities. This sub harmonic oscillation otherwise might occur if the duty cycle is higher than 50%.

In accordance with one or more of the embodiments an advantageous circuit is provided which combines the oscillator with a feedback adder circuit. A further advantage is a simple addition of the oscillator signal and the feedback signal without causing any delay.

In accordance with an aspect, an apparatus is provided which comprises an oscillator configured to generate a sawtooth waveform or a pulse-width modulated waveform, a capacitor, at least one of a charge current source and discharge current source for charging or discharging the capacitor, a switch for switching between charging and discharging of the capacitor, and at least one of a current feedback terminal connected to the capacitor, and an offset voltage element connected to the capacitor for generating an offset voltage. Advantageously, at least one of a feedback current or an offset voltage may be added with simple circuitry and high precision with no or only small delay.

The apparatus may e.g. be implemented as, or part of, an oscillator, power supply, dc/dc converter, etc.

In this or another embodiment the apparatus may comprise a resistor connected to the charge current source and the capacitor which is configured to generate an offset voltage, which may be variable or optionally constant, based on the charge current which may optionally constantly flowing, the offset voltage being added to an output voltage of the oscillator. The offset voltage can therefore be precisely generated with simple circuitry.

In accordance with the above or another embodiment, the apparatus may comprise a resistor connected to at least one of the feedback terminal and the capacitor, and configured to generate a voltage dependent on a feedback current supplied to the feedback terminal, the voltage generated by the resistor being added to an output voltage of the first oscillator. A reliable conversion of the feedback current to a voltage and a simple combination such as addition or subtraction of the feedback parameter to the sawtooth output voltage is achievable.

In accordance with one or more of the embodiments the apparatus may comprise a second oscillator configured to generate a sawtooth waveform or a pulse-width modulated waveform, a second capacitor, a second switch for switching between charging and discharging of the second capacitor, and at least one of a charge current source and a discharge current source for charging or discharging the second capacitor. The provision of at least two oscillators allows separation of a timing or time control of the sawtooth such as time location of the maximum and minimum values, and a setting of a current or voltage level of the generated output sawtooth waveform.

The or an apparatus may comprise at least one comparator configured to compare an electric potential of the second capacitor with at least one threshold level, and a switching stage connected to the output of the at least one comparator and configured to generate a switch control signal to be applied to the second switch.

In accordance with one or more of the embodiments the switch control signal may be applied to the first and second switch, ensuring synchronous switching.

The switching stage may e.g. be a latch or a flipflop device such as an RS flipflop.

Advantageously, the first switch and second switch may be configured to be switched synchronously so that the waveform phases are the same.

At least one error amplifier may be configured to generate an error signal depending on a difference between an output voltage and a reference voltage. The error amplifier may be configured to generate an output signal having a minimum voltage higher than zero volt.

In accordance with one or more of the embodiments an apparatus may comprise at least one of a comparator configured to generate a pulse-width modulated output signal depending on at least one of a sawtooth signal having an added offset voltage and a voltage generated based on a feedback current, and an error signal generated by an error amplifier.

In accordance with one or more of the embodiments a current or voltage converter such as a DC-DC converter (DC=direct or unipolar, positive or negative including zero, voltage or current) is provided which may comprise an apparatus as defined above or in the following description.

In accordance with another aspect or embodiment, a method is provided for converting a current or voltage to a current or voltage of different level which comprises generating a first sawtooth waveform by a first oscillator, adding at least one of a voltage depending on a feedback current, and an offset voltage, and switching the waveform of the first oscillator depending on a control signal generated by a second oscillator.

In accordance with another aspect or other embodiments, a computer program product, as well as an analog regulation circuit, is provided which comprises software codes for carrying out a method as defined above or below.

One or more embodiments may be used with high switching frequencies of actual DC/DC converters of up to 6 MHz or higher. In this case, at e.g. 6 MHz, it is not easy to add two signals with adequate current consumption and no extra signal delay. In accordance with one or more of the embodiments there is no need to provide an extra circuit for adding the two or more compensation or feedback signals, which allows to avoid any additional delay time and high current consumption.

Therefore, in accordance with one or more of the embodiments a low power solution for an analog controlled DC/DC converter with high switching frequencies is provided with low current consumption and low delay time.

In accordance with an aspect of the invention one or more embodiments are provided which have low delay and optionally no extra current demand.

According to one or more embodiments a circuit for adding a current feedback signal for DC/DC converter with high switching frequency may be implemented as a combination of an oscillator and an adder without extra delay. This combination reduces power consumption and reduces signal delay time.

Embodiments can e.g. be used for or in a power supply for an electronic device such as a camera module of a cellular phone.

One or more of the embodiments may be incorporated into stationary or mobile devices, for example handheld devices such as computers or phones like mobile or cellular phones.

DETAILED DESCRIPTION OF THE INVENTION

These and other aspects of the invention will be apparent from and elucidated with reference to the embodiment(s) described hereinafter and illustrated in the drawings.

The present invention is further elucidated by the following figures and examples, which are not intended to limit the scope of the invention. The person skilled in the art will understand that various embodiments may be combined.

DETAILED DESCRIPTION OF EMBODIMENTS

Figure 1:
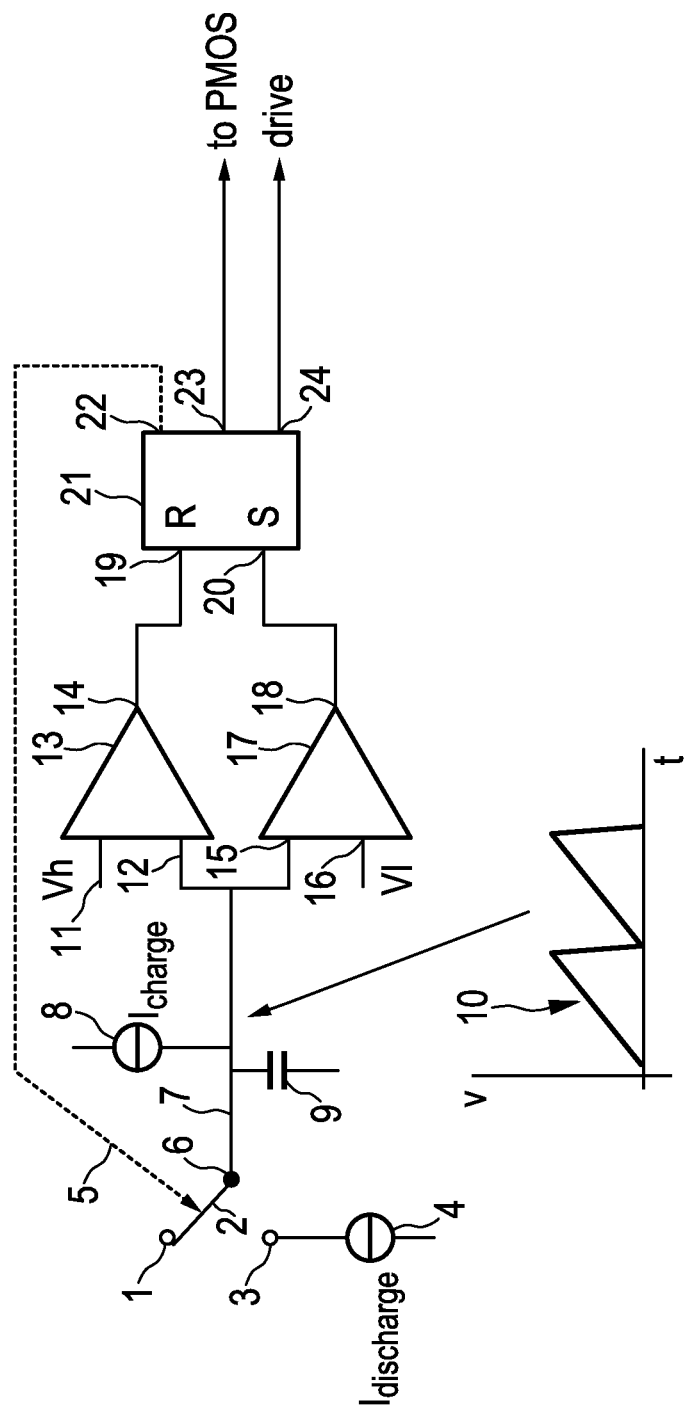
FIG. 1 shows a basic diagram illustrating an example embodiment of a pulse-width-modulated signal generating circuit in accordance with an exemplary implementation the invention, FIG. 2 schematically shows an example of an implementation of a primary oscillator and a replica oscillator in accordance with an exemplary implementation of the invention.

FIG. 1 shows a basic circuit diagram of an embodiment of an oscillator circuit for generating a saw-tooth signal and rectangular wave signal with optionally variable duty cycle.

The embodiment of the oscillator circuit shown in FIG. 1 comprises a switch 2 which can be switched between a first position connecting an unconnected or potential-free terminal 1 with a terminal 6, and a second position connecting a terminal 3 with terminal 6. The terminal 3 is connected to a current source 4 which generates a discharge current Idischarge. The discharged current optionally has constant value and is either continuously flowing or only flowing in case of a switching state of switch 2 in which the terminals 3 and 6 of switch 2 are connected. The switch 2 is controlled by a control signal applied via a line 5.

The terminal 6 is connected to a current source 8 which generates a charge current Icharge of optionally constant value. The line 7 is furthermore connected to a capacitor arrangement such as capacitor 9. The capacitor 9 may consist of a single capacitor or may comprise two or more capacitors connected in series or parallel or with additional elements such as one or more resistors or diodes etc. The other terminal of capacitor 9 is optionally connected to a reference potential such as ground potential. The capacitor 9 is therefore charged by current source 8 by an optionally constant current so that the potential of line 7 is linearly increasing, as shown by the ramp of the voltage/time diagram of FIG. 1 illustrating the voltage at line 7 and thus at terminal 6.

The line 7 is further connected to inputs 12 and 15 of operational amplifiers or comparators 13, 17. The amplifier or comparator 13 is supplied with a threshold voltage or value Vh representing a high voltage potential applied to its input 16. The other amplifier or comparator 17 is supplied with a low threshold voltage or potential V1 applied to its input 11. The comparator 13 generates a low or zero voltage signal at its output 14 as long as the voltage at its input 12 is lower than the voltage or potential at its input 11, Vh. When the voltage at input 12 reaches or exceeds the voltage Vh at input 11, the output 14 changes to high level which is applied to an input 19 of a switching circuit or switching stage 21 such as a flipflop. The input 19 may be connected to a reset input R of the switching stage 21.

Another control input 20, optional a set input S, of the switching stage 21 such as a flipflop is connected to an output 18 of the amplifier or comparator 17 which compares the voltage at line 7 with the low threshold potential V1 applied at input 16. The second control input 20 of the switching stage 21 is thus dependent on the actual voltage value at line 7, similar to the voltage at the other control input 19 of the switching stage 21. The switching stage 21 has an output 22 connected to control line 5 and generating the control voltage for controlling the switching state of switch 2. The switching stage 21 furthermore comprises outputs 23, 24 connected to a drive stage for generating drive signals for switching transistors such as PMOS (P-conductive Metal Oxide Semiconductor) transistors for generating a pulse-width modulated output signal.

The time/voltage diagram shown directly below capacitor 9 of FIG. 1 illustrates the sawtooth waveform or voltage 10 occurring at line 7 and depending on the switching actions of switch 2, the charge current and the discharge current of capacitor 9 determined by the switching states of switch 2. The sawtooth voltage 10 comprises linearly increasing slopes and rapidly decreasing slopes.

The oscillator shown in FIG. 1 is from relaxation type. The constant current ICHARGE generated by constant current source 8 loads capacitor 9 up to upper threshold Vh and sets the switching stage 21 such as a latch. The latched output of switching stage 21 at line 5 triggers switch 2 to switch to terminal 3 so that the discharge current IDISCHARGE is forced to flow and switched on. The discharge current discharges the capacitor 9 down to the lower threshold V1, and the switching stage 21 will be reset. The control voltage at line 5 therefore changes its level and the switch 2 is switched back to contact terminal 1. The discharge current will be switched off and the charging of capacitor 9 will be started again. The discharge current IDISCHARGE is higher, e.g. 5 to 50 times, or 15 to 30 times, or twenty-eight times higher than the load current ICHARGE and thus a sawtooth voltage with slowly increasing linear slope and rapidly decreasing linear slope is created at the capacitor 9, as shown by curve 10. Output signals of the stage 21 issued at outputs 23, 24 are used for further timing dependent actions in one or more other blocks not shown like a rectifier, e.g. an NMOS rectifier, or an anti-ringing-switch or the PMOS output stage, etc.

The thresholds or limits $V_h$, $V_1$ are set to $V_1=0.1V$ and $V_h=1.4V$ in this example. Due to the finite switching speed of the comparators 13, 17, the levels of the sawtooth voltage 10 are 0V respectively 1.5V.

Figure 2:
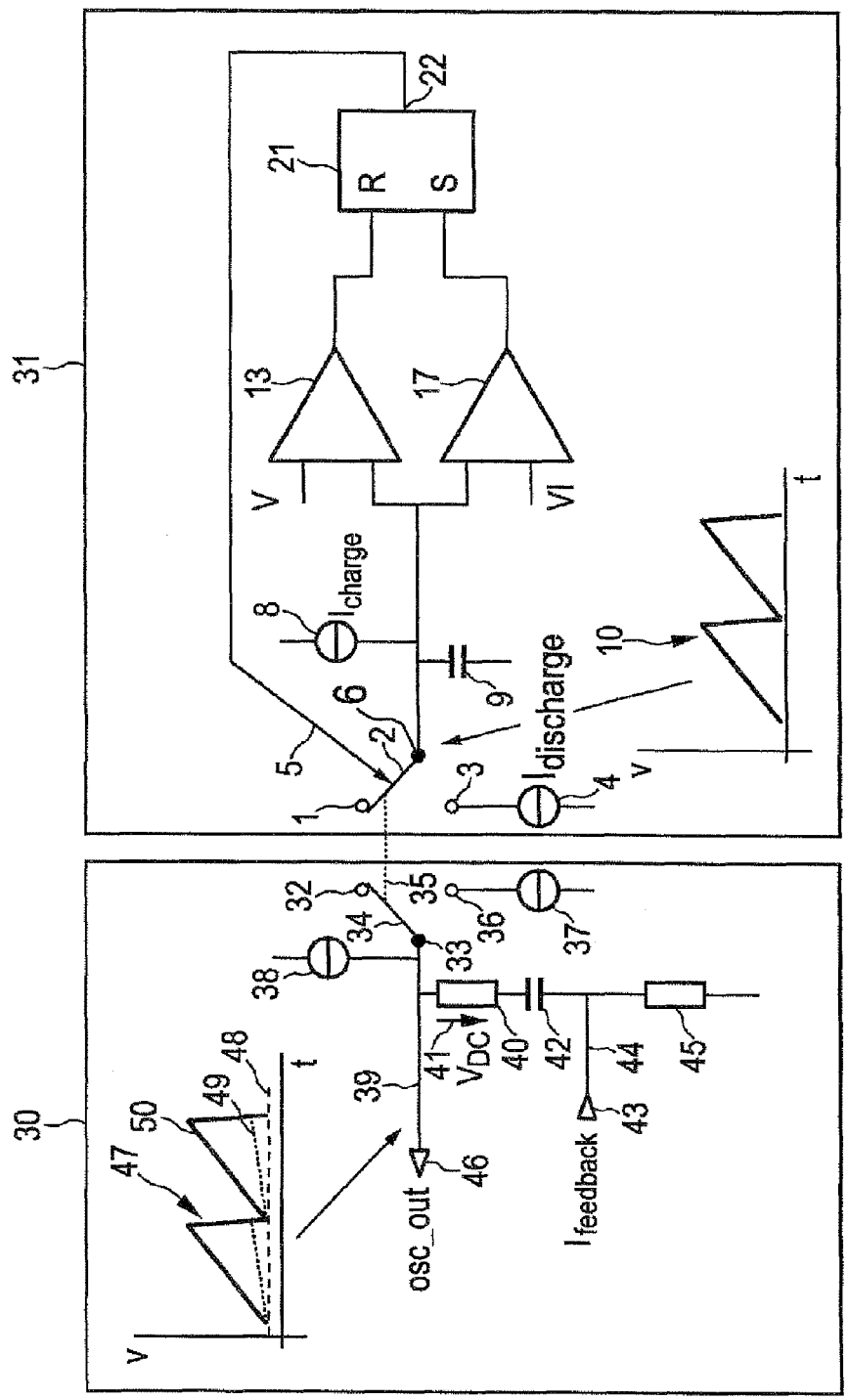

In accordance with one or more of the embodiments such as shown in FIG. 2, an oscillator, optionally a sawtooth oscillator, is configured as first part or first stage 31 to deliver a constant frequency and control signals that are supplied for the DC/DC converter timing. A second oscillator or second part or stage 30 may be configured as a replica of the first oscillator stage 31 and may represent a second stage. The output form of the second oscillator stage 30, such as frequency and/or time points of the maximum and minimum values or corner points of the sawtooth is the same as the output of the first stage 31 due to the controlling from the first stage 31. The first oscillator stage 31 may have the same structure and design as the oscillator stage shown in FIG. 1, and may act as a primary oscillator. The components of stage 31 may be identical to the components and interconnections shown in FIG. 1, as illustrated by the use of identical reference numerals and signs. Like reference numerals designate like components. The above and below description of the components of FIG. 1 likewise applies to the embodiment of FIG. 2. Although not shown in FIG. 2, the switching stage or latch 21 may additionally have output connections 23, 24 similar to the outputs shown in FIG. 1, optionally providing the same functions and control signals as outputs 23, 24.

The second stage 30 forming a replica oscillator comprises a switch 34 which can be switched to connect a terminal 33 either to an unconnected or potentially-unbound terminal 32 or to a terminal 36 which is connected to a constant current source 37 generating a discharge current for discharging a capacitor 42. The switch 34 is switched in complete synchronism with switch 2 of the primary oscillator 31, as represented by control line 35. As shown, in a switching position of switch 2 in which the terminals 1 and 6 are connected, the terminals 33 and 32 of switch 34 are likewise connected. When switch 2 is switched so as to connect terminals 6 and 3, the switch 34 is switched to connect terminals 33 and 36. The control line 5 therefore controls the switching operations of both switches 2 and 34 in synchronous manner.

The replica oscillator 30 further comprises a current source 38 generating an optionally constant charge current for continuously charging capacitor 42, and a discharge current source 37 generating an optionally constant discharge current. Terminal 33 of switch 34 is connected to a line 39 having an output terminal 46, osc out, for outputting the oscillator sawtooth output signal. The line 39 is connected to the charge current source 38 and to a resistor 40 provided between the line 39 and the capacitor 42. When switch 34 is switched over so as to connect terminals 33 and 36, the capacitor 42 will be discharged via resistor 40 and the discharge current source 37. The current flowing through resistor 40 generates a DC voltage VDDC as symbolized by arrow 41.

The other terminal of capacitor 42 opposite to the terminal connected to resistor 40, is connected via a resistor 45 to ground or reference potential. A feedback current $I_{feedback}$ is supplied to a terminal 43 which is connected via line 44 to the lower capacitor 42 terminal and resistor 45.

In the circuits of FIGS. 1 and 2, a switch such as a p-channel MOSFET, PMOS, may be supplied with the pulse width modulated signal generated at the output 23, 24 or 22. In another embodiment, this switch may also be an n-channel MOSFET.

The feedback current $I_{feedback}$ supplied to input terminal 43 may be generated by sensing the current flowing in the power FET such as the PMOS of the DC-DC converter, for instance by sensing the drain or source current of the MOSFET. In another embodiment, an actual inductor current flowing in a low pass filter connected to the drain or source terminal of the power FET. Such current feedback provides a current-mode control as well as a voltage-mode control so as to force a peak current to be the same for each switch cycle of constant voltage. Therefore, the current feedback is able to remove sub harmonics. In an embodiment, a RC low pass filter may be connected to an inductor connected to the source or drain of the power FET. The terminal 43 may therefore be connected to a current sense device sensing the load current flowing in a power FET having its gate connected to output 23 or 24, or in an inductor connected to the drain or source of such a power FET, or the like. The small voltage/time diagram shown in block 30 of FIG. 2 illustrates the sawtooth waveform 47 which has an identical timing as the waveform 10 of FIG. 1. Contrary to waveform 10 of FIG. 1 going down to zero voltage, waveform 47 has a positive DC offset 48, as indicated by a dashed line, which may correspond to voltage $V_{DC}$ 41, as well as an $I_{feedback}$ generated voltage component 49, as indicated by a dotted line, leading to an overall sawtooth voltage 50.

The output signal of the second stage 30 can be influenced by nearly any signal without disturbance of the timing which is dictated by oscillator stage 31.

A first influence of the second stage 30 is the current feedback signal Ifeedback that is fed from input 43 to resistor 45 at the base of the second stage oscillator. This will give a signal addition. A second optionally additional influence is the constant dc shift, VDC 41, of the output signal at output 46 that is supplied to the following stages. All influences are with zero delay.

In the present embodiment there is resistor 40 in the charge path of the second stage 30 that is constantly flowing. The constantly flowing charge current leads to constant DC shift $V_{DC}$.

In accordance with one or more of the embodiments a feedback circuit for a switch mode power supply is provided to create a slope compensation to avoid sub harmonic oscillation or oscillation due to instabilities. This sub harmonic oscillation might otherwise occur if the duty cycle is higher than 50%. The circuit advantageously combines the oscillator with the feedback adder circuit. A further advantage is the simple addition of the oscillator signal and the feedback signal. Due to the fact that the switching frequency of modern DC/DC converter is increasing this becomes more and more important. For example, at 6 MHz, it is not easy to add two signals with adequate current consumption, e.g. when considering to subtract such feedback signals in an extra circuit from the control input.

In accordance with an embodiment, an oscillator is provided as shown in FIG. 1 and FIG. 2, right-hand part. The complete oscillator may comprise two stages, a first part for delivering the source frequency, as shown in FIG. 1, and a second part shown in FIG. 2 on the left-hand side. The second part is a replica of the frequency generated by the first stage and will be influenced by the feedback. The second stage is a replica of the first stage. FIG. 2 shows the replica of oscillator with primary oscillator.

Therefore, in accordance with one or more of the embodiments a combination of an oscillator and an adding circuit is provided.

The capacitors 9 and 42 are optionally the same. Further, the charge and discharge currents are optionally the same. The current sources 8 and 38 are the same or generating the same charge current. Likewise, the current sources 4 and 37 may optionally be the same or generating the same discharge current. Further, the same switching times of the primary oscillator 31 and the replica oscillator 30 lead to the same voltage characteristic in these embodiments so that the voltage characteristic of the replica and primary oscillators are similar.

In this and other embodiment arrangements every influence of external or internal sources advantageously has no effect on the oscillator frequency. So the replica oscillator may e.g. be used for one or more of the following or other influences, namely the current feedback, and the DC-offset for the output voltage.

The current feedback $I_{feedback}$ may be a part of the output current and may be fed to resistor 45 at the base point of the capacitor 42. So there is an addition of the sawtooth and the feedback signal. The feedback increases with increasing output current.

The DC-offset $V_{DC}$ is provided to shift the output signal of about e.g. 50 to 200, or 80 to 120, or about 100 mV, as shown at 48. Due to that shift there is no need for the following stages to have a signal down to 0V. The oscillator signal and the error signal from feedback are both connected to a comparator 75 (see FIG. 3) and an error amplifier 65 does not need to be able to go down to 0V to be lower than the oscillator signal in order to get zero output signal at the comparator 75 (see FIG. 3).

Figure 3:
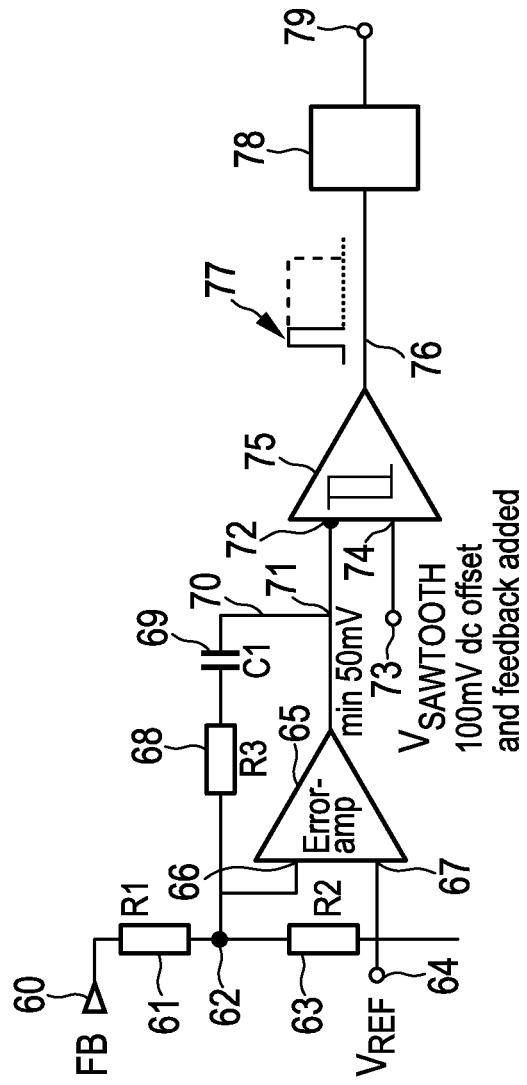
FIG. 3 shows an embodiment of an example configuration of a dc-to-dc converter in accordance with an embodiment in line with the invention.

FIG. 3 illustrates an embodiment of a DC/DC converter in accordance with an implementation of the invention. FIG. 3 shows the connections between the error-amplifier output and the sawtooth.

The embodiment of FIG. 3 comprises a terminal 60 for applying a voltage feedback signal which is derived from the converter output signal generated e.g. at an output terminal 79 of FIG. 3. The output voltage generated by the DC/DC converter of FIG. 3 at output 79 is supplied via terminal 60 to a voltage divider comprising a series connection of resistors 61, 63 of equal or different resistance values connected in series between terminal 60 and a reference or a ground potential supplied to the lower terminal of resistor 63. A tap 62 of the resistor voltage divider comprising resistors 61, 63 is connected to an input, for example a non-inverting input, 66 of error amplifier 65 such as a difference amplifier. A reference voltage $V_{REF}$ applied to input 64 is supplied to the other input, e.g. inverting input, 67 of the error amplifier 65. An integrating feedback loop is connected between an output line 71 of the error amplifier 65 and the input 66 thereof. The feedback loop comprises a line 70 having a capacitor 69 and a resistor 68 connected in series between the output line 71 and the input 66.

The error amplifier 65 generates an output signal having a positive voltage of at least more than e.g. 10 mV or optionally a minimum of 50 mV. As a result, components connected to the output of the error amplifier 65 will always receive a positive output voltage varying between a minimum of e.g. 50 mV and a higher positive voltage.

The output 71 of error amplifier 65 is applied to an input 72 of a comparator 75 such as a bistable multivibrator which may e.g. have an hysteresis behavior as represented by the symbol shown in comparator 75 and changing between high and low output voltage in form of rectangular edges.

Another input 74 of comparator 75 is supplied at line 73 with a sawtooth voltage $V_{SAWTOOTH}$ having e.g. an offset voltage of e.g. 100 mV dc, and feedback added. The signal $V_{SAWTOOTH}$ applied to line 73 may correspond to the oscillator output signal generated at output 46 of FIG. 2. In this embodiment, the output terminal 46 and the line 73 and input terminal 74 are directly connected to each other.

The comparator 75 generates a pulse width modulated signal 77 at output line 76 in form of a rectangular wave having an optionally variable duty ratio between a low and high value such as e.g. 0 to 100%. The variable duty ratio is indicated by the broken line of signal 77 indicating the variable falling edge of the pwm signal 77.

The pwm signal 77 generated by comparator 75 is supplied to an output stage 78 generating a dc voltage of optionally steady state. The output stage 78 may for example comprise a low pass filter comprising e.g. an inductor connected at one end to the input of output stage 78, that is line 76, and at the other end to a capacitor having its other terminal connected to ground or reference potential. The connection point between the inductor and the capacitor may serve as an output terminal supply the rectified and smoothened output voltage of the DC/DC converter according to this or other embodiments. Optionally, a resistor or load may be connected in parallel to the just described capacitor of output stage 78 representing a load of the output stage 78. The smoothened voltage at output terminal 79 may be supplied to input 60, as mentioned above.

The voltage $V_{REF}$ applied to input 64 of FIG. 3 may have a fixed or variable value so as to set the desired DC+ output voltage of the DC/DC converter according to the embodiment.

In accordance with one or more of the embodiments the circuit is implemented in a 6 MHz fully analog DC/DC converter for camera applications in mobile phones. An application or embodiment covers a PCB, printed circuit board, coil inside a very small PCB power control or converter pack and only external capacitors. The DC/DC converter and the capacitors may be embedded in the PCB.

In one or more embodiments, to establish a working DC/DC controller a power stage and a dependent current measurement circuit, a bandgap reference, a free-wheeling diode and some digital logic may be provided beside the circuits mentioned above or illustrated in the attached illustrations.

Other variations to the disclosed embodiments can be understood and effected by those skilled in the art in practicing the claimed invention, from a study of the drawings, the disclosure, and the appended claims.

A single unit or devices may fulfill the functions of several items recited in the description or claims. Measures and features mentioned in the description and claims can be arbitrarily combined.

Each of the features recited above or shown in the drawings or described above in separate embodiments or dependent claims may be provided alone or may be advantageously combined with one, two or more of the other features recited above or shown in the drawings in any arbitrary combination so as to form embodiments in accordance with possible optional implementations of the invention.

While the invention has been illustrated and described in detail in the drawings and foregoing description, such illustration and description are to be considered illustrative or exemplary and not restrictive. The invention is not limited to the disclosed embodiments. For example, it is possible to operate the invention in an embodiment for measuring other signals or parameters.

Other variations to the disclosed embodiments can be understood and effected by those skilled in the art in practicing the claimed invention, from a study of the drawings, the disclosure, and the appended claims. A computer program may be stored or distributed on a suitable medium, such as an optical storage medium or a solid-state medium, optionally supplied together with or as part of other hardware, and may also be distributed in other forms, such as via the Internet or other wired or wireless telecommunication systems.

In the claims, the word "comprising" does not exclude other elements or steps, and the indefinite article "a" or "an" does not exclude a plurality. A single device or other unit may fulfill the functions of several items recited in the description, drawings or claims. The mere fact that certain measures are recited in mutually different dependent claims does not indicate that a combination of these measured cannot be used to advantage.

Any reference signs in the claims should not be construed as limiting the scope.

The excitation and measurement processes, steps, and determinations can be performed by one or several units or devices. For example, the control and measurement can be performed by a single unit of by any other number of different units. The calculations and determinations and/or the control of the system and/or of the device in accordance with the above described features can be implemented as program code means of a computer program and/or as dedicated hardware.

The invention claimed is:

1. An apparatus, comprising:
   a first oscillator configured to generate one of a sawtooth waveform and a pulse-width modulated (PWM) waveform, the first oscillator further comprising:
   a first capacitor,
   a charge current source configured to charge the first capacitor,
   a discharge current source configured to discharge the first capacitor,
   a first switch configured to switch between the charging and the discharging of the first capacitor,
   a current feedback terminal connected to the first capacitor; and
   an offset voltage element connected between the first switch and the first capacitor that is configured to generate an offset voltage.

2. The apparatus according to claim 1, further comprising:
   a resistor connected to the charge current source and the first capacitor, and configured to generate a constant offset voltage based on a constant flowing charge current, the constant offset voltage being added to an output voltage of the first oscillator.

3. The apparatus according to claim 1, further comprising:
   a resistor connected to the current feedback terminal and the first capacitor, and configured to generate a voltage dependent on a feedback current supplied to the current feedback terminal, the generated voltage being added to an output voltage of the first oscillator.

4. The apparatus according to claim 1, further comprising:
   a second oscillator configured to generate one of a sawtooth waveform and a pulse-width modulated (PWM) waveform, the second oscillator further comprising:
   a second capacitor,
   a second switch configured to switch between charging and discharging of the second capacitor,
   a charge current source configured to charge the second capacitor, and
   a discharge current source configured to discharge the second capacitor.

5. The apparatus according to claim 4, further comprising:
   at least one comparator configured to compare an electric potential of the second capacitor with at least one threshold level; and
   a switching stage connected to an output of the at least one comparator and configured to generate a switch control signal to be applied to the second switch.

6. The apparatus according to claim 5, wherein the switch control signal is applied to the first and second switches.

7. The apparatus according to claim 5, wherein the switching stage is one of a latch and a flip-flop device.

8. The apparatus according to claim 4, wherein the first switch and the second switch are configured to be switched synchronously.

9. The apparatus according to claim 1, further comprising:
   at least one error amplifier configured to generate an error signal depending on a difference between an output voltage and a reference voltage.

10. The apparatus according to claim 9, wherein the error amplifier is configured to generate an output signal having a minimum voltage higher than zero volts.

11. The apparatus according to claim 1, further comprising:
    at least one comparator configured to generate a pulse-width modulated (PWM) output signal depending on at least one of a sawtooth signal having an added offset voltage and a voltage generated based on a feedback current; and
    an error amplifier configured to generate an error signal.

12. A current or voltage converter, comprising the apparatus according to claim 1.

13. The converter according to claim 12, wherein the converter is configured as a DC-DC converter.

14. A method for converting a current or voltage to a different level, the method comprising:
    generating a first sawtooth waveform by a first oscillator;
    adding to the first sawtooth waveform at least one of a voltage depending on a feedback current and an offset voltage;
    generating a second sawtooth waveform by a second oscillator; and
    synchronously switching the first and second waveforms of the first and second oscillator depending on a control signal generated by the second oscillator.

15. The apparatus of claim 1, wherein a discharge current is between five and fifty times larger than a charging current.

16. The apparatus of claim 15, wherein the discharge current is between fifteen and thirty times larger than the charging current.

17. The apparatus of claim 16, wherein the discharge current is substantially twenty-eight times larger than the charging current.

18. The apparatus of claim 4, wherein the second oscillator is a replica of the first oscillator.

19. The apparatus according to claim 1, wherein the current feedback terminal provides both current-mode control and voltage-mode control.

20. The apparatus according to claim 11, wherein the comparator is a bistable multivibrator.

* * * * *